(12) United States Patent
Adkins et al.

(10) Patent No.: US 6,452,512 B1
(45) Date of Patent: Sep. 17, 2002

(54) METHOD FOR INITIALIZING AN ANALOG ENCODER

(75) Inventors: Christopher Alan Adkins; Michael Anthony Marra, III; Jay William Vessels, all of Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 09/898,663

(22) Filed: Jul. 3, 2001

(51) Int. Cl.$^7$ .......................... H03M 1/22; G01D 5/34
(52) U.S. Cl. .................... 341/13; 250/231.16
(58) Field of Search ............... 250/231.13, 232, 250/233, 231.16, 205, 214 C; 327/38; 341/155, 13, 137; 340/653

(56) References Cited

U.S. PATENT DOCUMENTS

| | | |
|---|---|---|
| 3,680,964 A | 8/1972 | Granqvist |
| 4,074,128 A | 2/1978 | Harris, Jr. et al. |
| 4,375,592 A | 3/1983 | Cox et al. |
| 4,475,086 A | 10/1984 | Allen |
| 4,600,835 A | 7/1986 | Ishida et al. |
| 4,647,769 A | 3/1987 | Stone et al. |
| 4,737,635 A | 4/1988 | Uchida |
| 4,803,354 A | 2/1989 | Onodera et al. |
| 5,066,953 A | 11/1991 | Lengenfelder et al. |
| 5,075,540 A | 12/1991 | Taniguchi et al. |
| 5,120,954 A | 6/1992 | Taniguchi |
| 5,302,944 A | 4/1994 | Curtis |
| 5,644,127 A * | 7/1997 | Ohmae ............... 250/231.16 |
| 6,304,825 B1 * | 10/2001 | Nowak et al. ............. 702/94 |

FOREIGN PATENT DOCUMENTS

| | | |
|---|---|---|
| JP | 60-76612 | 5/1985 |
| JP | 60-140118 | 7/1985 |

* cited by examiner

*Primary Examiner*—Patrick Wamsley
(74) *Attorney, Agent, or Firm*—Jacqueline M. Daspit; Michael J. Nieberding

(57) ABSTRACT

A method of analog encoder initialization involves repeatedly adjusting an encoder light element energization level and dc offsets of the encoder channels to produce desired signals.

16 Claims, 6 Drawing Sheets

US 6,452,512 B1

METHOD FOR INITIALIZING AN ANALOG ENCODER

TECHNICAL FIELD

The present invention relates generally to analog encoders and, more particularly, to a method for initializing an analog encoder to produce desired first and second encoder output signals.

BACKGROUND OF THE INVENTION

The cost of analog encoders increases as the encoder components such as the encoder mask, light element and photo sensors are made more precise and/or with higher tolerances. When working with less expensive encoders the encoder output signals produced have a tendency to be further removed from ideal signals.

Accordingly, it would be advantageous to provide an encoder initialization method which adjusts certain control parameters to achieve desired or acceptable encoder output signals.

SUMMARY OF THE INVENTION

In one aspect, a method for initializing an analog encoder system which produces first and second encoder output signals from first and second channels is provided. The system including an analog encoder with a light element, first and second photo sensors producing signals as a function of light received, and dc offset circuitry associated with the first and second channels for offsetting the signals produced by the first and second photo sensors. The method includes the steps of: (a) establishing a desired signal range for the first and second encoder output signals, the range defined by a max and a min; (b) repeatedly adjusting an energization level of the encoder light element and a dc offset of each channel to place a max of each channel above an upper threshold which is below the max of the established range and to place the min of each channel below a lower threshold which is greater than the min of the established range; (c) after step (b), adjusting the dc offset of at least one of the channels in order to set a mean of both channels substantially the same.

In another aspect, an initialization method involves: (a) establishing a desired signal range for the first and second encoder output signals, the range defined by a max and a min; (b) setting the encoder light element to a zero energization level; (c) after step (b), adjusting the dc offset of each channel until a maximum amplitude and a minimum amplitude of each channel are within the established range and the maximum amplitude of each channel is near the max of the established range; (d) after step (c), increasing an energization level of the encoder light element in a series of increments until the minimum amplitude of at least one of the first and second channels is below a low threshold; (e) after to step (d), adjusting the dc offset of each channel to move the maximum amplitude of each channel near the max of the established range; (f) after step (e), increasing the energization level of the encoder light element in a series of increments until the minimum amplitude of both of the first and second channels is less than another low threshold.

In a further aspect, an initialization method involves (a) establishing a desired signal range for the first and second encoder output signals, the range defined by a max and a min; (b) setting the encoder light element to a zero energization level; (c) adjusting the dc offset of each channel until a maximum amplitude and minimum amplitude of each channel is within the established range and the minimum amplitude of each channel near the min of the established range; (d) after step (c), increasing an energization level of the encoder light element in a series of increments until the maximum amplitude of at least one of the first and second channels is above a high threshold; (e) after step (d), adjusting the dc offset of each channel to move the minimum amplitude of each channel near the min of the established range; (f) after step (e), increasing the energization level of the encoder light source in a series of increments until the maximum amplitude of both of the first and second channels is above another high threshold.

DETAILED DESCRIPTION

Figure 1:
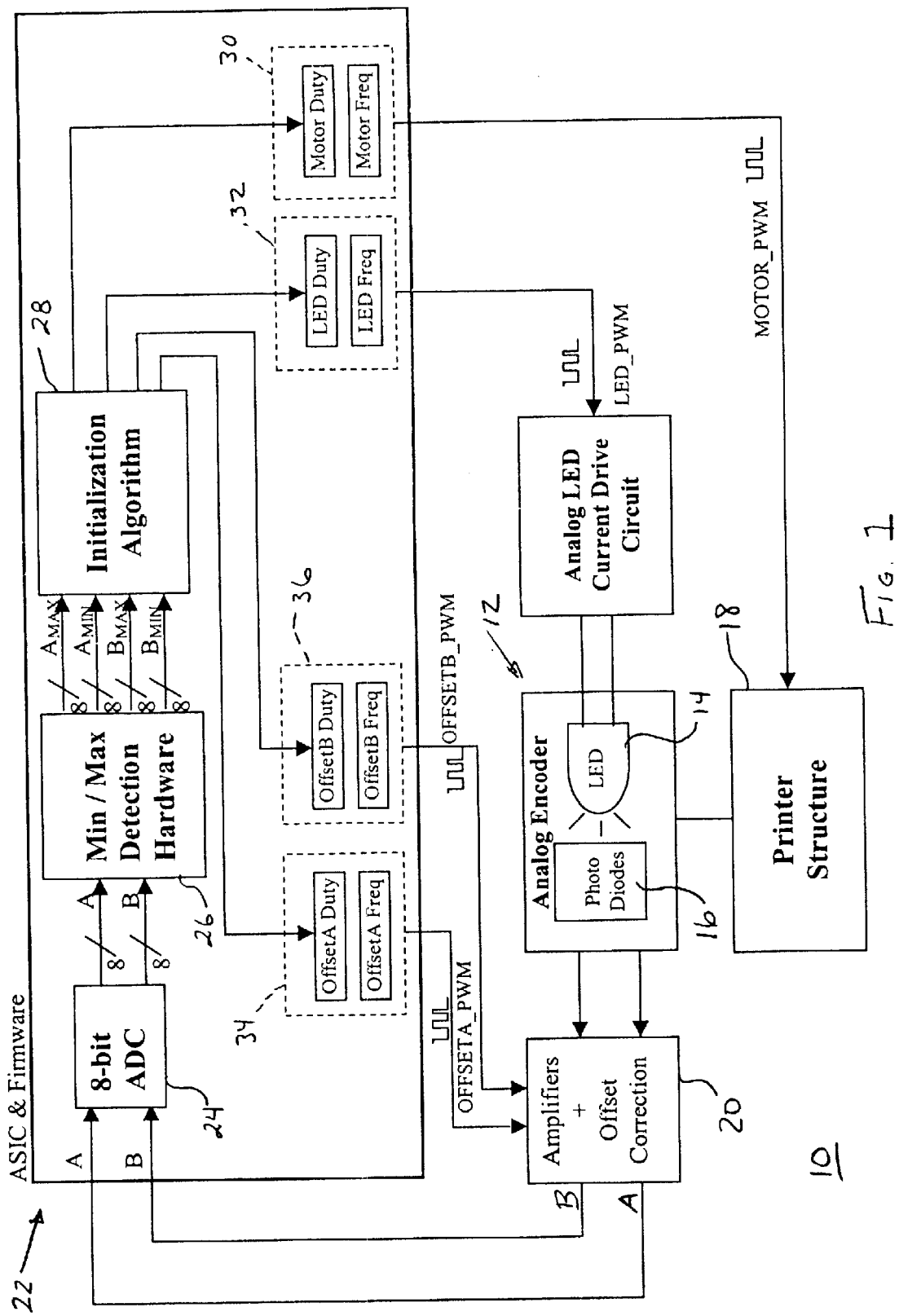
FIG. 1 is a schematic of an encoder system.

Referring to FIG. 1, a schematic of an encoder system 10 is illustrated and includes an analog encoder 12 having a light element 14 such as an LED and photo sensors 16 which may take the form of photo diodes. In the case of a rotary encoder a rotating, windowed mask may be positioned between the light element 14 and photo sensors 16. In the case of a linear encoder the light element 14 and photo sensors 16 may move relative to a fixed, windowed encoder mask strip. A structure 18 such as a rotating printer feed roller or a reciprocating print head carriage mounted for movement across a paper path is associated with the encoder 12 as is commonly known in the art. The encoder 12 includes amplification and offset circuitry 20 for each of the A and B channels. A and B outputs of the encoder are provided to a controller 22. In the illustrated embodiment the controller 22 is formed by an ASIC in combination with firmware or other code. An A/D converter 24 receives the analog A and B signals of the encoder 12. The AID converter 24 outputs the converted A and B signals to a min/max detection circuit 26. The min/max detection circuit outputs min and max values for each of the A and B signals for analysis or examination by an initialization module 28 which may be formed by firmware code. The initialization module is associated with a motor control PWM module 30, an encoder energization PWM module 32, an offsetA PWM module 34 and an offsetB PWM module 36. In each case the initialization module 28 may set one or both of a duty cycle and frequency which the PWM module uses to produce its output PWM signal. The PWM signal MOTOR_PWM output by the motor control PWM module 30 is provided to control the movement of a motor associated with the printer structure 18. The PWM signal LED_PWM output by the encoder energization PWM module 32 is provided to a current drive circuit 38 for controlling the energization level of the encoder light element 14. The PWM signal OFFSETA_PWM output by the offsetA PWM module 34 controls the dc offset applied to the A channel signal of the encoder 12. Similarly, PWM signal OFFSETB_PWM output by the offsetB PWM module 36 controls the dc offset applied to the B channel signal of the encoder 12.

Generally it is desirable that the A and B analog encoder signals be produced with the same amplitude and in the same range. However, variances between electrical components and mechanical imperfections tend to cause the signals produced by the photo sensors 16 to differ in amplitude and range. In the encoder system 10 two primary parameters can be adjusted in attempt to control the A and B encoder signals produced, namely the energization level of the light element as set by the LED_PWM signal and the dc offset of the A and B channels as set by the OFFSETA_PWM and OFFSETB_PWM signals respectively. Adjusting light source energization tends to primarily vary the amplitude of the encoder signals produced while adjusting the dc offsets tends to primarily vary the range or window within which the encoder signals are produced. In addition to the different result obtained by adjusting encoder light element energization as compared to adjusting dc offsets, the timing involved in implementing such adjustments tends to differ greatly. By way of example, the encoder signals may settle after only several milliseconds after a ten percent (10%) adjustment in the encoder light element energization level while a comparable adjustment in the dc offset of a channel may not be fully reflected in the channel output for as long as 100 milliseconds. Accordingly, an initialization method which involves making adjustments to the encoder light element energization level often and adjustments to the dc offsets of the A and B channels more rarely has been developed.

Figure 2:
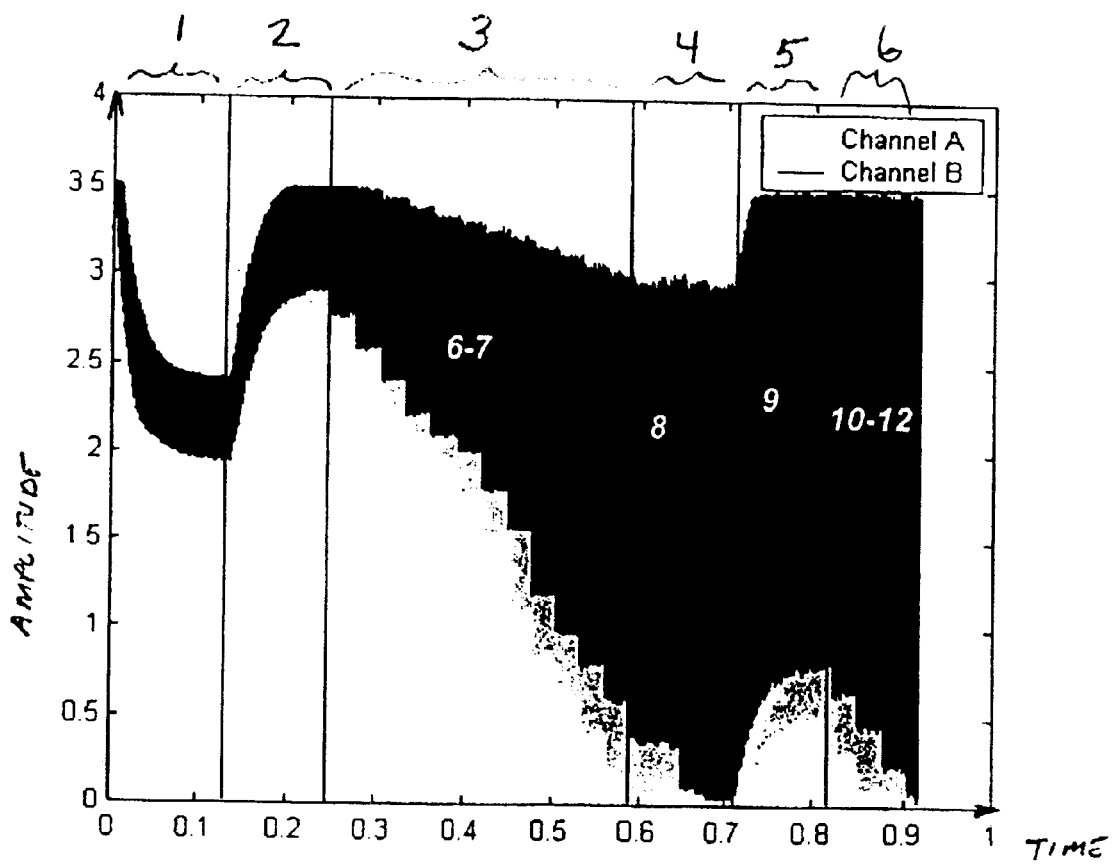
FIG. 2 is a graph depicting encoder signal changes during an initialization sequence.
Figure 3A:
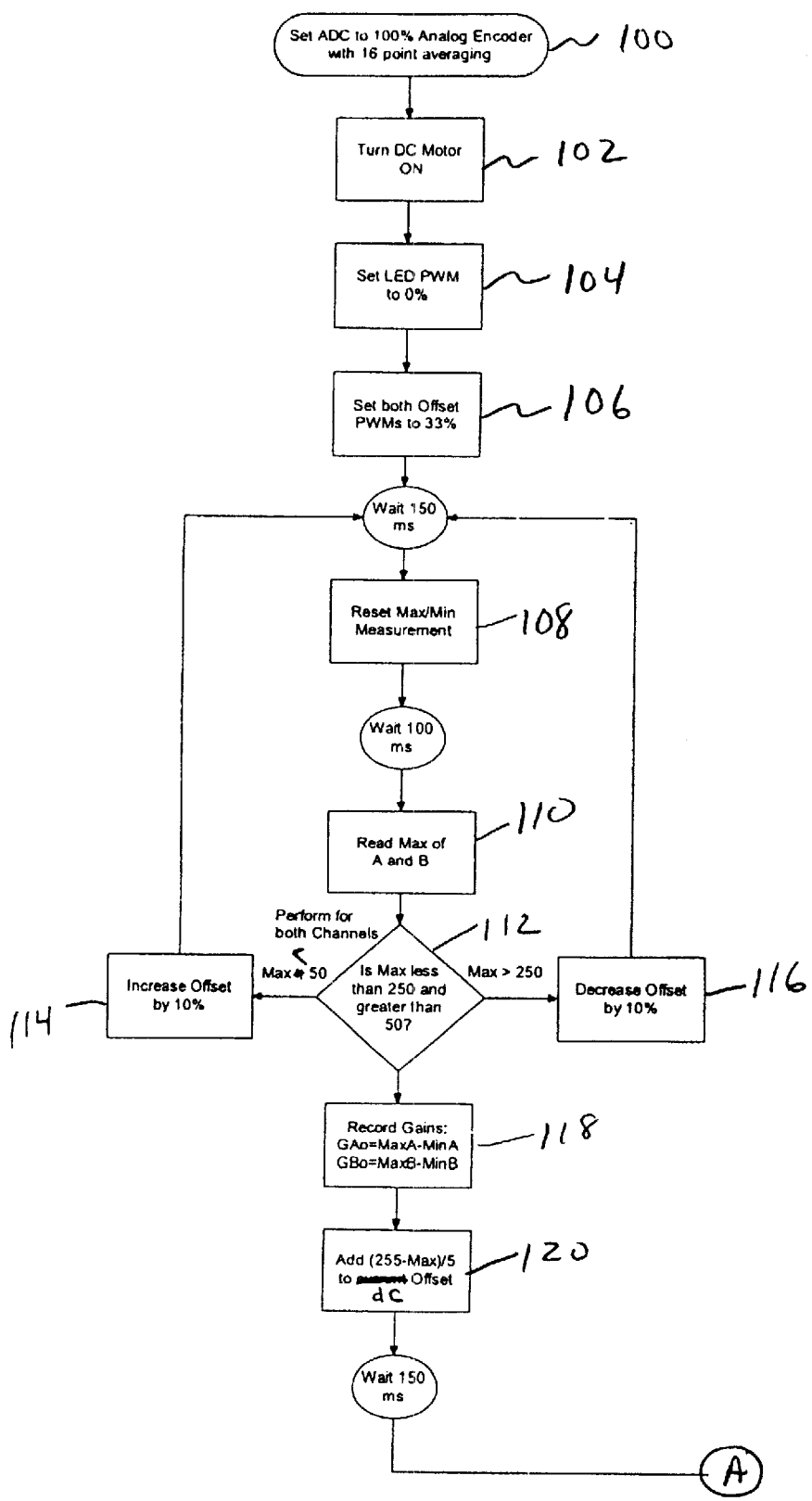
FIGS. 3A–3C form a flow chart of initialization steps performed by the initialization module of FIG. 1.
Figure 3B:
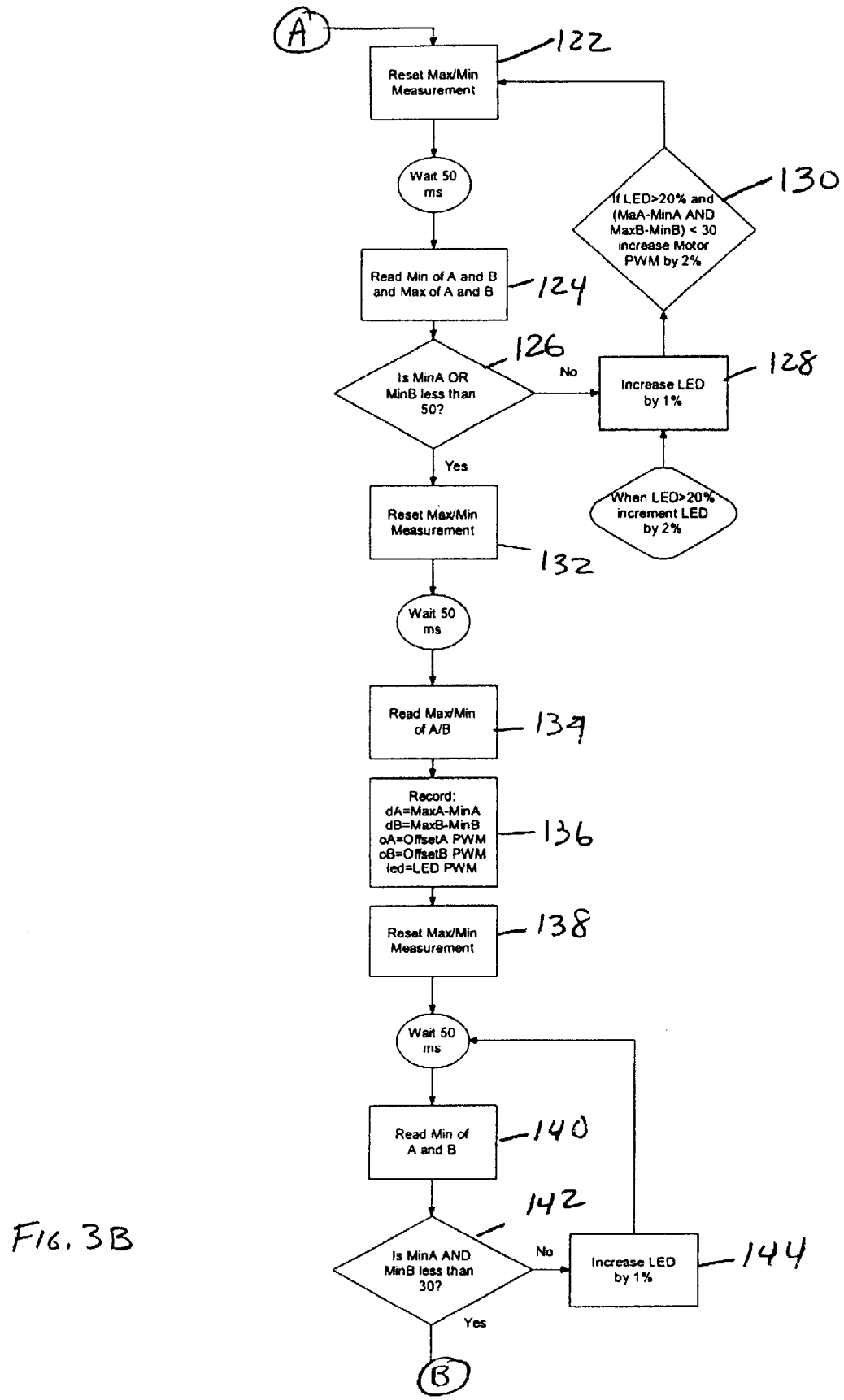
Figure 3C:
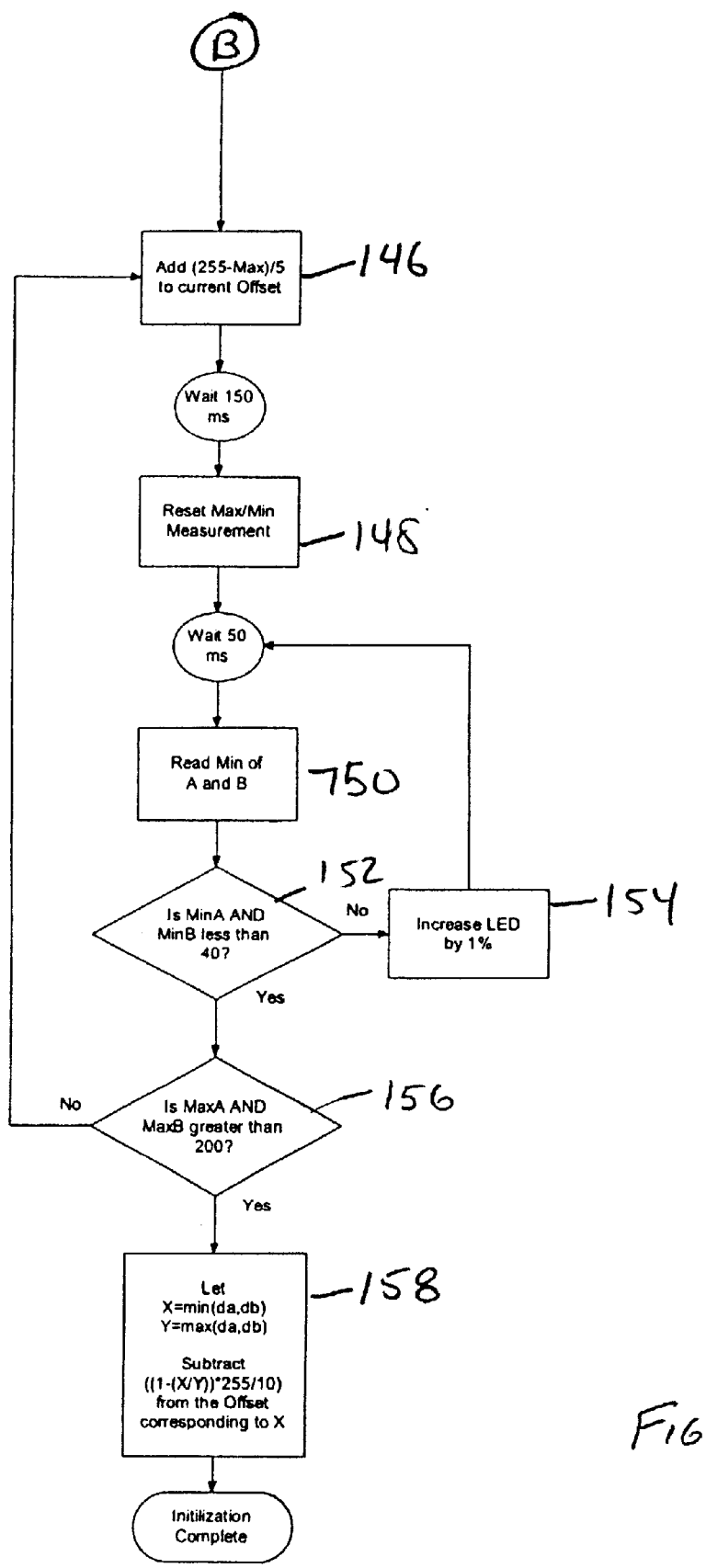

In particular, and with reference to FIGS. 1, 2 and 3, in one embodiment the method involves establishing a desired signal range for the A and B encoder output signals, the range defined by a max and a min. In this example the defined range is 0 volts as the min to 3.5 volts as the max as shown in FIG. 2, but many other ranges could be defined. In this example it is also assumed that the amplitude of the output signal of each photo sensor 16 is maximum when receiving no light and decreases as more light is received. In step 100 (FIG. 3) the A/D converter 24 is set to 16 point averaging. At step 102 the dc motor associated with the printer structure 18 and encoder 12 is turned on and is operated at a constant speed. In step 104 the encoder light element 14 is set to a zero energization level by outputting a constant low signal at LED_PWM and at step 106 the dc offset of both A and B channels is set to a predetermined level such as 33% of a maximum dc offset by setting the duty cycles of each of the OFFSETA_PWM and OFFSETB_PWM to 33%. Other predetermined dc offset levels could be used. After the encoder light element energization level is set to zero and the dc offsets are set to the predetermined level, a maximum amplitude of each channel is examined at steps 108, 110 and, if necessary, at steps 112, 114, 116 the dc offset of each channel is adjusted until the maximum amplitude of each channel is within a range more narrowly defined than and internal to the established range. This step is shown in region 1 of FIG. 2. At step 118 the maximum amplitude of each channel and a minimum amplitude of each channel are examined and stored to provide an output gain measurement at zero energization. At step 120 the dc offset associated with each channel is adjusted to move the maximum amplitude of each channel near the max of the established range as shown in region 2 of FIG. 2. At steps 122, 124, 126, 128, and as shown in region 3 of FIG. 2, an energization level of the encoder light element is increased in a series of increments until the minimum amplitude of at least one of the first and second channels is below a first low threshold, the first low threshold being above the min of the established range. At step 130 if the amplitude of the signals does not increase it is assumed that the motor is not moving and the energization level of the dc motor is increased. At steps 132, 134, and 136 a determined max to min range of each of the channels is stored, the dc offset associated with each channel is stored,
and the energization level of the encoder light element is stored. At steps 138, 140, 142 and 144, and as shown in region 4 of FIG. 2, the energization level of the encoder light element is increased in a series of increments until the minimum amplitude of at least one of the first and second channels is below a second low threshold, the second low threshold less than the first low threshold. At step 146, and as shown in region 5 of FIG. 2, the dc offset of each channel is adjusted to move the maximum amplitude of each channel near the max of the established range. At steps 148, 150, 152, and 154, and as shown in region 6 of FIG. 2, the energization level of the encoder light element is increased in a series of increments until the minimum amplitude of both of the first and second channels is less than a third low threshold, in this case 40 on the digital scale. At step 156, if the maximum amplitude of either of the first and second channels is below an upper threshold, in this case 200 on the digital scale, steps 146, 148, 150, 152 and 154 are repeated. Based upon the stored max to min ranges of step 136, the dc offset of the channel having the larger stored max to min range is adjusted at step 158 in order to set a mean of both channels substantially the same.

While the above described method is discussed with reference to an encoder having photo sensors which output a decreasing amplitude signal as more light is received, a similar initialization method could be implemented for an encoder in which the photo sensors output an increasing amplitude signal as more light is received by targeting dc offset adjustments based upon comparison of the signal minimum amplitudes to the min of the established range and by targeting encoder light element energization adjustments based upon comparison of the signal maximum amplitudes to upper thresholds. For example, in the above described embodiment each comparison of a minimum amplitude to a lower threshold would convert to a comparison of a maximum amplitude to an upper threshold. Similarly, each comparison of the maximum amplitude to an upper threshold or the max of the established range would convert to a comparison of the minimum amplitude to a lower threshold or the min of the established range.

Figure 4:
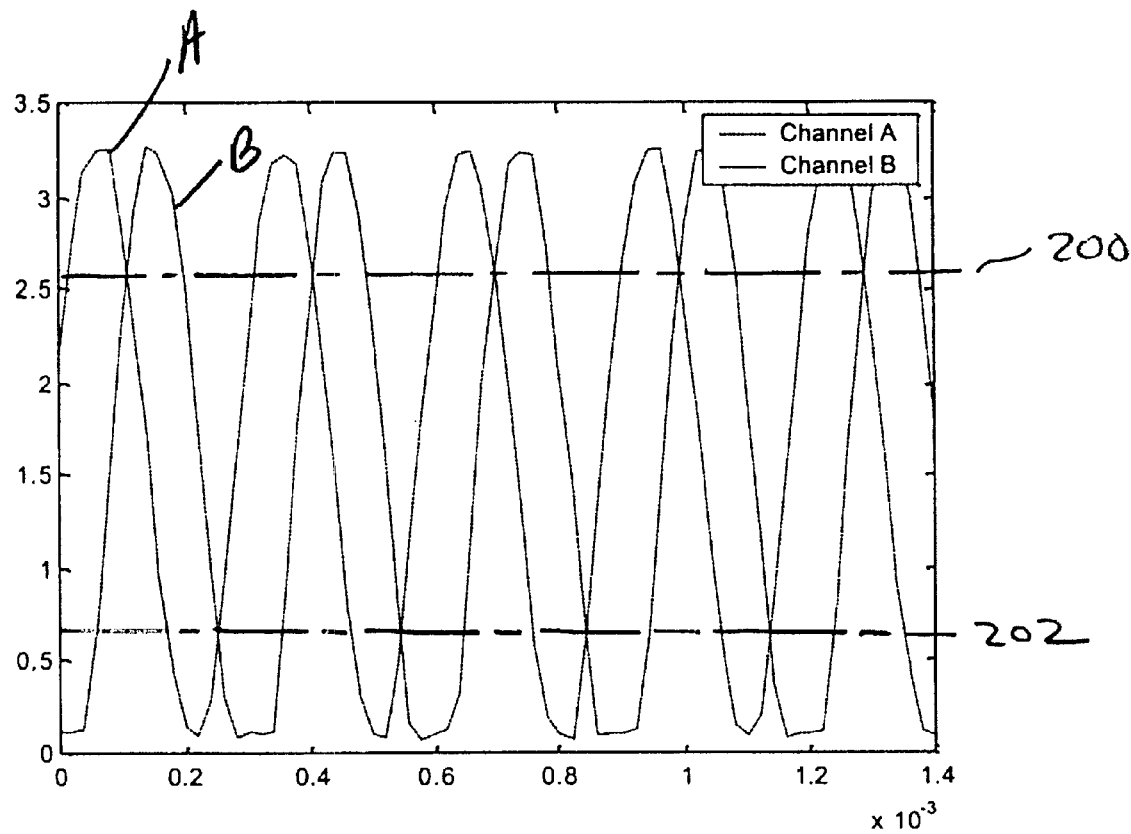
FIG. 4 is a graph showing resulting A and B signals.

In either case, in one embodiment the result may be an encoder system producing the A and B signal shown in FIG. 4, where each of the signals is substantially linear in a range defined by an upper intersection amplitude 200 and a lower intersection amplitude 202.

Additionally, in a given application certain steps might be skipped and additional steps might be added. Accordingly, although the invention has been described above in detail referencing the illustrated embodiments thereof, it is recognized that various changes and modifications could be made without departing from the spirit and scope of the invention.

What is claimed is:

1. A method for initializing an analog encoder system which produces first and second encoder output signals from first and second channels, the system including an analog encoder with a light element, first and second photo sensors producing signals as a function of light received, and dc offset circuitry associated with the first and second channels for offsetting the signals produced by the first and second photo sensors, the method comprising the steps of:

(a) establishing a desired signal range for the first and second encoder output signals, the range defined by a max and a min;

(b) setting the encoder light element to a zero energization level and setting a dc offset of both channels at a predetermined level;

(c) after step (b), examining a maximum amplitude of each channel and, if necessary, adjusting the dc offset of each channel until the maximum amplitude of each channel is within a range that falls within the established range and is more narrowly defined;

(d) after step (c), storing the maximum amplitude of each channel and a minimum amplitude of each channel;

(e) after step (d), adjusting the dc offset associated with each channel to move the maximum amplitude of each channel near the max of the established range;

(f) after step (e), increasing an energization level of the encoder light element in a series of increments until the minimum amplitude of at least one of the first and second channels is below a first low threshold, the first low threshold being above the min of the established range;

(g) after step (f), storing a determined max to min range of each of the channels, storing the dc offset associated with each channel, and storing the energization level of the encoder light element;

(h) after step (g), repeatedly increasing the energization level of the encoder light element in a series of increments until the minimum amplitude of at least one of the first and second channels is below a second low threshold, the second low threshold less than the first low threshold;

(i) after step (h), adjusting the dc offset of each channel to move the maximum amplitude of each channel near the max of the established range;

(j) after step (i), increasing the energization level of the encoder light element in a series of increments until the minimum amplitude of both of the first and second channels is less than a third low threshold;

(k) after step (j), and if the maximum amplitude of either of the first and second channels is below an upper threshold, repeating steps (i) and j); and (l) after step (k), and based upon the stored max to min ranges of step (g), adjusting the dc offset of the channel having the larger stored max to min range in order to set a mean of both channels substantially the same.

2. The method of claim 1 wherein the energization level of the encoder light source is adjusted by changing a light element PWM duty cycle and wherein the dc offset of each channel is adjusted by changing a respective signal PWM duty cycle.

3. The method of claim 2 wherein step (b) involves setting the light element PWM duty cycle to zero and setting both signal PWM duty cycles to between 20% and 40%.

4. The method of claim 1 wherein step (1) involves decreasing the dc offset of the channel having the larger stored max to min range by an amount which is half a difference between the stored max to min ranges of the first and second channels.

5. A method for initializing an analog encoder system which produces first and second encoder output signals from first and second channels, the system including an analog encoder with a light element, first and second photo sensors producing signals as a function of light received, and dc offset circuitry associated with the first and second channels for offsetting the signals produced by the first and second photo sensors, the method comprising the steps of:

(a) establishing a desired signal range for the first and second encoder output signals, the range defined by a max and a min;

(b) repeatedly adjusting an energization level of the encoder light element and a dc offset of each channel to place a max of each channel above an upper threshold which is below the max of the established range and to place the min of each channel below a lower threshold which is greater than the min of the established range;

(c) after step (b), adjusting the dc offset of at least one of the channels in order to set a mean of both channels substantially the same.

6. The method of claim 5 wherein the energization level of the encoder light element is adjusted by changing a light element PWM duty cycle and wherein the dc offset of each channel is adjusted by changing a respective signal PWM duty cycle.

7. The method of claim 5 wherein the initialization procedure results in first and second encoder output signals which are substantially linear in a range defined by an upper intersection amplitude and a lower intersection amplitude.

8. The method of claim 5 wherein the first and second photo sensors produce output signals which decrease in amplitude as the first and second photo sensors receive more light.

9. The method of claim 5 wherein the first and second photo sensors produce output signals which increase in amplitude as the first and second photo sensors receive more light.

10. A method for initializing an analog encoder system which produces first and second encoder output signals from first and second channels, the system including an analog encoder with a light element, first and second photo sensors producing signals as a function of light received, and dc offset circuitry associated with the first and second channels for offsetting the signals produced by the first and second photo sensors, the method comprising the steps of:

(a) establishing a desired signal range for the first and second encoder output signals, the range defined by a max and a min;

(b) setting the encoder light element to a zero energization level;

(c) after step (b), adjusting the dc offset of each channel until a maximum amplitude and a minimum amplitude of each channel are within the established range and the maximum amplitude of each channel is near the max of the established range;

(d) after step (c), increasing an energization level of the encoder light element in a series of increments until the minimum amplitude of at least one of the first and second channels is below a low threshold;

(e) after step (d), adjusting the dc offset of each channel to move the maximum amplitude of each channel near the max of the established range;

(f) after step (e), increasing the energization level of the encoder light element in a series of increments until the minimum amplitude of both of the first and second channels is less than another low threshold.

11. The method of claim 10 further comprising:

(g) after step (f), and if the maximum amplitude of either of the first and second channels is below an upper threshold, repeating steps (e) and (f).

12. The method of claim 11 further comprising:

(h) after step (g), adjusting the dc offset of at least one of the channels in order to set a mean of both channels substantially the same.

13. The method of claim 10 wherein step (d) involves:

(1) increasing the energization level of the encoder light element in a first series of increments until the minimum amplitude of at least one of the first and second channels is below a first low threshold, the first low threshold being above the min of the established range;

(2) after step (1), storing a determined max to min range of each of the channels, storing the dc offset associated with each channel, and storing the energization level of the encoder light element;

(3) after step (2), increasing the energization level of the encoder light element in a second series of increments until the minimum amplitude of at least one of the first and second channels is below a second low threshold, the second low threshold less than the first low threshold.

14. A method for initializing an analog encoder system which produces first and second encoder output signals from first and second channels, the system including an analog encoder with a light element, first and second photo sensors producing signals as a function of light received, and dc offset circuitry associated with the first and second channels for offsetting the signals produced by the first and second photo sensors, the method comprising the steps of:

(a) establishing a desired signal range for the first and second encoder output signals, the range defined by a max and a min;

(b) setting the encoder light element to a zero energization level;

(c) adjusting the dc offset of each channel until a maximum amplitude and minimum amplitude of each channel is within the established range and the minimum amplitude of each channel near the min of the established range;

(d) after step (c), increasing an energization level of the encoder light element in a series of increments until the maximum amplitude of at least one of the first and second channels is above a high threshold;

(e) after step (d), adjusting the dc offset of each channel to move the minimum amplitude of each channel near the min of the established range;

(f) after step (e), increasing the energization level of the encoder light source in a series of increments until the maximum amplitude of both of the first and second channels is above another high threshold.

15. The method of claim 14 further comprising:

(g) after step (f), and if the minimum amplitude of either of the first and second channels is above a low threshold, repeating steps (e) and (f).

16. The method of claim 15 further comprising:

(h) after step (g), adjusting the dc offset of at least one of the channels in order to set a mean of both channels substantially the same.

* * * * *